(12) United States Patent
Wu

(10) Patent No.: US 11,245,366 B2
(45) Date of Patent: Feb. 8, 2022

(54) DISTRIBUTED AMPLIFIERS WITH CONTROLLABLE LINEARIZATION

(71) Applicant: Analog Devices, Inc., Norwood, MA (US)

(72) Inventor: Jonathan Xiang Wu, Billerica, MA (US)

(73) Assignee: Analog Devices, Inc., Norwood, MA (US)

( * ) Notice: Subject to any disclaimer, the term of this patent is extended or adjusted under 35 U.S.C. 154(b) by 98 days.

(21) Appl. No.: 16/789,998

(22) Filed: Feb. 13, 2020

(65) Prior Publication Data

US 2021/0257974 A1 Aug. 19, 2021

(51) Int. Cl.

| H03F 3/60 | (2006.01) |
|---|---|
| H03F 1/32 | (2006.01) |
| H01L 23/66 | (2006.01) |
| H03F 3/45 | (2006.01) |
| H03F 1/02 | (2006.01) |
| H04B 1/38 | (2015.01) |

(52) U.S. Cl.
CPC ............ *H03F 1/3211* (2013.01); *H01L 23/66* (2013.01); *H03F 1/0211* (2013.01); *H03F 1/3205* (2013.01); *H03F 3/45273* (2013.01); *H03F 3/604* (2013.01); *H03F 3/607* (2013.01); *H01L 2223/6644* (2013.01); *H03F 2200/451* (2013.01); *H04B 1/38* (2013.01)

(58) Field of Classification Search
CPC ... H03F 3/45; H03F 3/60; H03F 3/602; H03F 3/605; H03F 1/22; H03F 1/223
USPC .......................................... 330/286, 289, 311
See application file for complete search history.

(56) References Cited

U.S. PATENT DOCUMENTS

| 2,958,046 A | 10/1960 | Watters |
| 3,887,863 A | 6/1975 | Brokaw |
| 4,728,902 A | 3/1988 | Gleason et al. |
| 4,797,628 A | 1/1989 | Gruchalla et al. |
| 5,066,926 A | 11/1991 | Ramachandran et al. |

(Continued)

OTHER PUBLICATIONS

Nguyen et al., "A Highly Linear InP Distributed Amplifier Using Ultra-wideband Intermodulation Feedforward Linearization", 2018 IEEE/MTT-S International Microwave Symposium, pp. 1356-1359, Jun. 2018, in 4 pages.

*Primary Examiner* — Steven J Mottola
(74) *Attorney, Agent, or Firm* — Knobbe, Martens, Olson & Bear, LLP

(57) ABSTRACT

Distributed amplifiers with controllable linearization are provided herein. In certain embodiments, a distributed amplifier includes a differential input transmission line, a differential output transmission line, and a plurality of differential distributed amplifier stages connected between the differential input transmission line and the differential output transmission line at different points or nodes. The distributed amplifier further includes a differential nonlinearity cancellation stage connected between the differential input transmission line and the differential output transmission line and providing signal inversion relative to the differential distributed amplifier stages. The differential nonlinearity cancellation stage operates with a separately controllable bias from the differential distributed amplifier stages, thereby providing a mechanism to control the linearity of the distributed amplifier.

20 Claims, 9 Drawing Sheets

(56) References Cited

U.S. PATENT DOCUMENTS

| | | | |
|---|---|---|---|
| 5,196,805 | A | 3/1993 | Beckwith et al. |
| 5,945,847 | A | 8/1999 | Ransijn |
| 6,064,258 | A | 5/2000 | Shulman |
| 6,094,099 | A * | 7/2000 | Kobayashi ............ H03G 1/0023 330/254 |
| 7,161,429 | B2 | 1/2007 | Boreysha et al. |
| 7,733,185 | B2 | 6/2010 | Suzuki |
| 7,808,319 | B2 | 10/2010 | Kim et al. |
| 8,134,407 | B2 | 3/2012 | Wurcer et al. |
| 8,169,264 | B2 | 5/2012 | Grondahl et al. |
| 8,786,368 | B2 | 7/2014 | Benson |
| 9,252,723 | B2 | 2/2016 | Afsahi |
| 2004/0219898 | A1 | 11/2004 | Bult et al. |
| 2006/0244536 | A1* | 11/2006 | Heydari ................ H03F 3/604 330/286 |
| 2008/0106335 | A1 | 5/2008 | Kimura |
| 2009/0072916 | A1 | 3/2009 | Bilionis et al. |
| 2013/0321080 | A1 | 12/2013 | Jahanian et al. |
| 2016/0065154 | A1* | 3/2016 | Tatsumi .............. H03F 3/45179 330/5 |
| 2017/0359042 | A1* | 12/2017 | Dascher ................ H03F 3/605 |
| 2018/0034420 | A1 | 2/2018 | Mastantuono et al. |

* cited by examiner

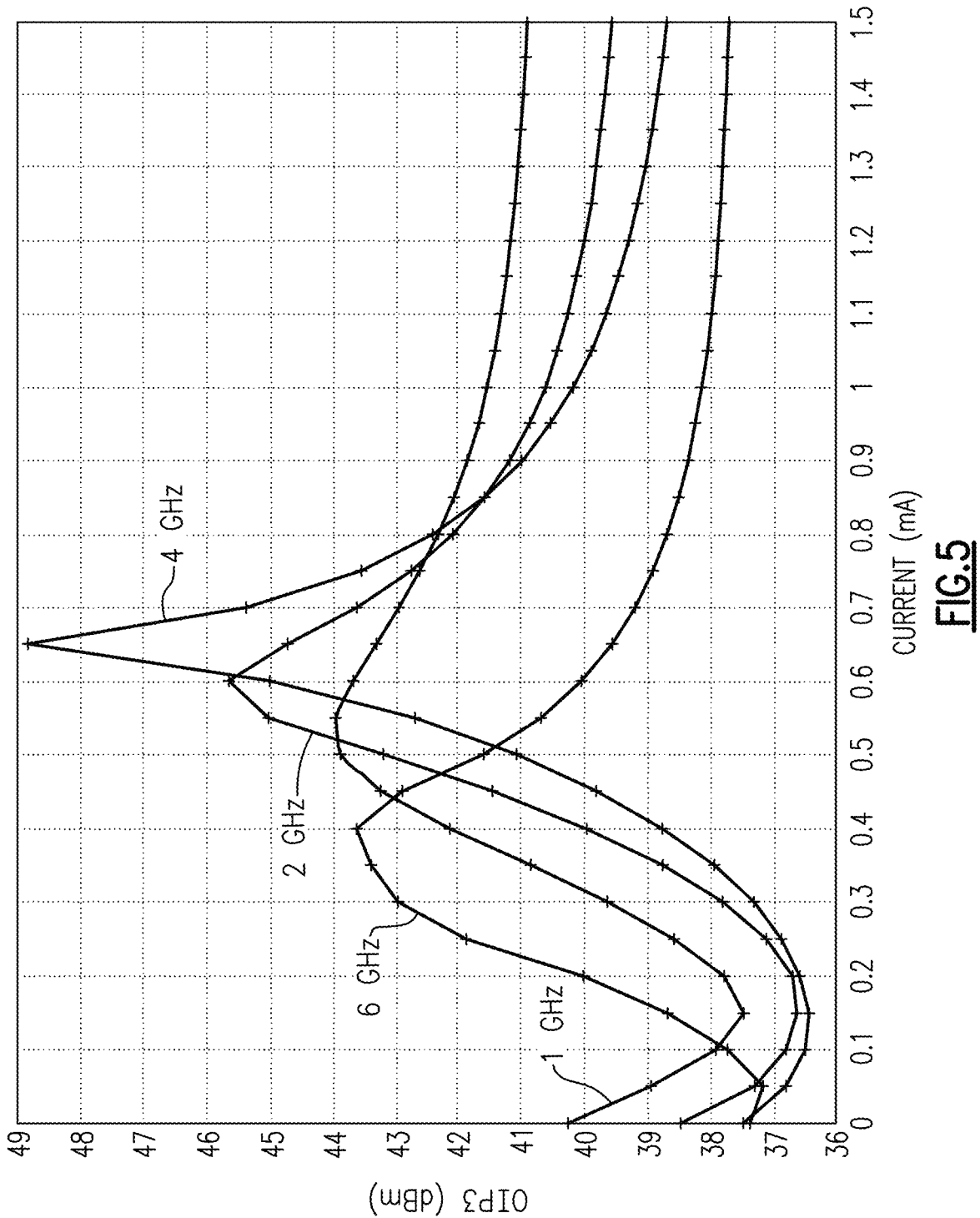

DISTRIBUTED AMPLIFIERS WITH CONTROLLABLE LINEARIZATION

FIELD OF THE DISCLOSURE

Embodiments of the invention relate to electronic systems, and more particularly, to distributed amplifiers.

BACKGROUND

A distributed amplifier is a type of radio frequency (RF) amplifier that includes an input transmission line for receiving an RF input signal, an output transmission line for providing an amplified RF output signal, and multiple distributed amplifier stages each connected between the input transmission line and the output transmission line at different points or positions.

Distributed amplifiers offer a number of benefits, including, but not limited to, a large gain-bandwidth product, high output power, and/or high input and output impedance. Example applications of distributed amplifiers include aerospace, cellular infrastructure, and/or instrumentation.

SUMMARY OF THE DISCLOSURE

Distributed amplifiers with controllable linearization are provided herein. In certain embodiments, a distributed amplifier includes a differential input transmission line, a differential output transmission line, and a plurality of differential distributed amplifier stages connected between the differential input transmission line and the differential output transmission line at different points or nodes. The distributed amplifier further includes a differential non-linearity cancellation stage connected between the differential input transmission line and the differential output transmission line and providing signal inversion relative to the differential distributed amplifier stages. The differential non-linearity cancellation stage operates with a separately controllable bias from the differential distributed amplifier stages, thereby providing a mechanism to control the linearity of the distributed amplifier. Thus, the bias of the differential non-linearity cancellation stage can be tuned to mitigate third-order intermodulation distortion (IMD3) of the distributed amplifier, thereby achieving a high degree of amplifier linearity.

In one aspect, a distributed amplifier with controllable linearization is provided. The distributed amplifier includes a differential input transmission line configured to receive a radio frequency (RF) input signal, a differential output transmission line, a plurality of differential distributed amplifier stages each connected between the differential input transmission line and the differential output transmission line, and a differential non-linearity cancellation stage connected between the differential input transmission line and the differential output transmission line and providing an inversion to the RF input signal relative to the plurality of differential distributed amplifier stages. The plurality of differential distributed amplifier stages are configured to amplify the RF input signal to generate an amplified RF output signal on the differential output transmission line. Additionally, a bias of the differential non-linearity cancellation stage is separately controllable from a bias of the plurality of differential distributed amplifier stages.

In another aspect, a method of linearizing a distributed amplifier is provided. The method includes receiving a radio frequency (RF) input signal as an input to a differential input transmission line. The method further includes amplifying the RF input signal to generate an amplified RF output signal using a plurality of differential distributed amplifier stages and a differential non-linearity cancellation stage each connected between the differential input transmission line and a differential output transmission line, the differential non-linearity cancellation stage providing an inversion to the RF input signal relative to the plurality of differential distributed amplifier stages. The method further includes separately controlling a bias of the differential non-linearity cancellation stage relative to a bias of the plurality of differential distributed amplifier stages to linearize the plurality of differential distributed amplifier stages.

In another aspect, a semiconductor die is provided. The semiconductor die includes a differential input transmission line, a differential output transmission line, a plurality of differential distributed amplifier stages each connected between the differential input transmission line and the differential output transmission line, a differential non-linearity cancellation stage connected between the differential input transmission line and the differential output transmission line and providing a signal inversion relative to the plurality of differential distributed amplifier stages, and a bias control circuit configured to separately control a bias of the differential non-linearity cancellation stage and a bias of the plurality of differential distributed amplifier stages.

BRIEF DESCRIPTION OF THE DRAWINGS

FIG. 5 depicts one example of plots of output third-order intercept point (OIP3) versus non-linearity cancellation bias current for different frequencies.

DETAILED DESCRIPTION OF EMBODIMENTS

Figure 1:
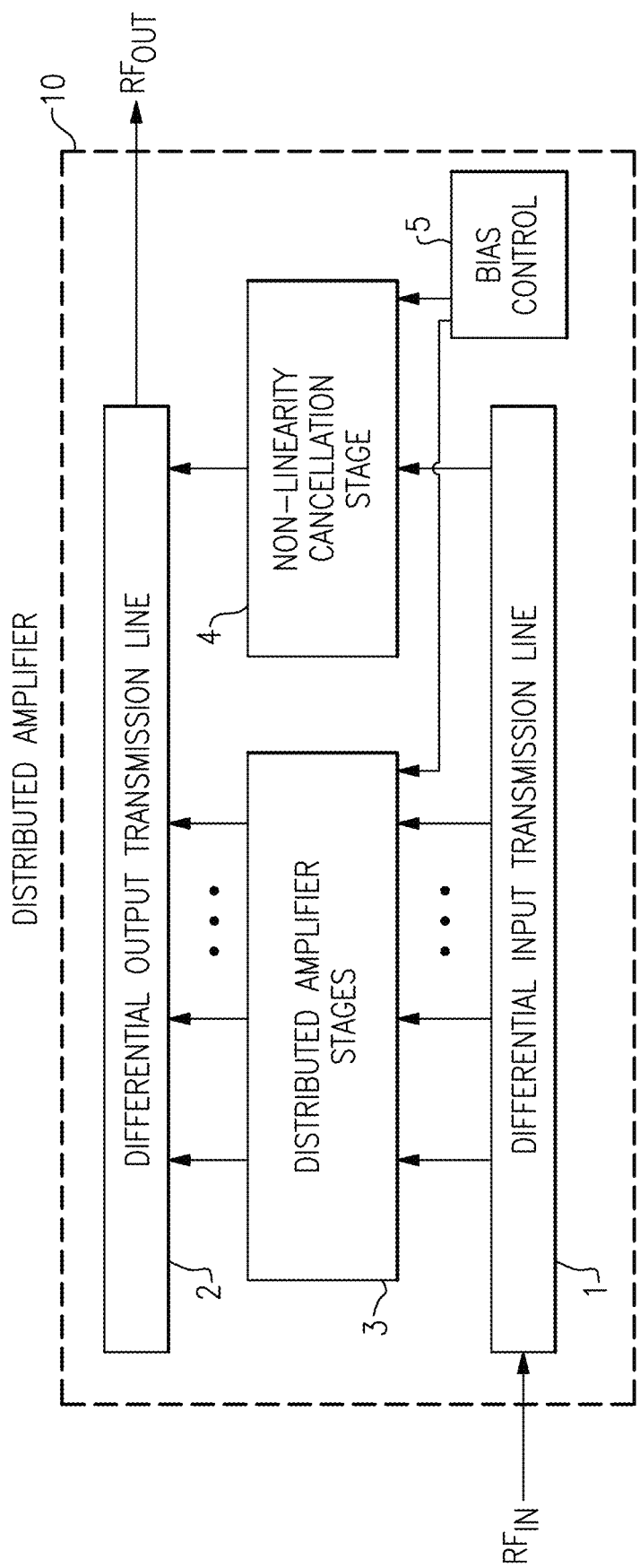
FIG. 1 is a schematic diagram of a distributed amplifier according to one embodiment.

The following detailed description of embodiments presents various descriptions of specific embodiments of the invention. However, the invention can be embodied in a multitude of different ways. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Distributed amplifiers with controllable linearization are provided herein. In certain embodiments, a distributed amplifier includes a differential input transmission line, a differential output transmission line, and a plurality of differential distributed amplifier stages connected between the differential input transmission line and the differential output transmission line at different points or nodes. The distributed amplifier further includes a differential non-linearity cancellation stage connected between the differential input transmission line and the differential output transmission line and providing signal inversion relative to the differential distributed amplifier stages. The differential non-linearity cancellation stage operates with a separately controllable bias from the differential distributed amplifier stages, thereby providing a mechanism to control the linearity of the distributed amplifier.

For example, the bias of the differential non-linearity cancellation stage can be tuned to mitigate third-order intermodulation distortion (IMD3) of the distributed amplifier, thereby achieving a high degree of amplifier linearity.

In certain implementations, the differential distributed amplifier stages are each implemented as a differential cascode stage (for instance, using a pair of common source transistors or common emitter transistors stacked with one or more pairs of cascode transistors), and the differential non-linearity cancellation stage serves to mitigate IMD3 arising from non-linear capacitance of the cascode transistors of the differential distributed amplifier stages. Such non-linearity can arise from variations in RF signal level of the differential output transmission line across an RF signal cycle, which gives rise to changes in parasitic capacitances of the cascode transistors.

The differential non-linearity cancellation stage can be connected between the differential input transmission line and the differential output transmission line at a wide variety of locations, and can have its capacitance absorbed into the transmission lines such that total bandwidth of the distributed amplifier is not adversely impacted. Furthermore, two or more differential non-linearity cancellation stages can be included. In certain implementations, the differential non-linearity cancellation stage is located after the differential distributed amplifier stages along the input and output transmission lines. Implementing the differential non-linearity cancellation stage in this manner provides efficient non-linearity cancellation since the RF signal waveform is typically larger at the end of the differential output transmission line than at the start of the differential output transmission line.

In certain implementations, the differential distributed amplifier stages are implemented as differential cascode stages including a pair of input transistors (for instance, a pair of common source transistors or a pair of common emitter transistors) stacked with at least one pair of cascode transistors, and a pair of distortion cancellation transistors that are cross-coupled with the input transistors and operate with a separately controllable bias current. Additionally, the relative bias current between the pair of input transistors and the pair of distortion cancellation transistors is controlled to provide non-linearity cancellation to the pair of input transistors (also referred to herein as transconductance ($g_m$) non-linearity trimming).

In such implementations, two mechanisms for non-linearity cancellation are provided: (i) controlling the biasing of the pair of distortion cancellation transistors to cancel non-linearity of the pair of input transistors; and (ii) controlling the biasing of the differential non-linearity cancellation stage to provide further non-linearity cancellation (for instance, any residual non-linearity after the initial distortion cancellation) associated with the cascode transistors.

In certain implementations, the pair of input transistors are biased using a first bias current from a first controllable current source and the pair of distortion cancellation transistors are biased using a second bias current from a second controllable current source. Additionally, the first bias current can be implemented to be proportional to absolute temperature (PTAT) and/or the second bias current can be implemented to be complementary to absolute temperature (CTAT). Implementing the bias currents in this manner aids in providing robust linearity across temperature variation. In certain implementations, the distributed amplifier's stages include degeneration resistors, and the PTAT current from the first controllable current source and/or the CTAT current from the second controllable current source is generated based on blending with a zero to absolute temperature (ZTAT) current source to account for the temperature independence of the degeneration resistors.

By blending a PTAT or CTAT current with a suitable amount of ZTAT current, better temperature tracking of a transistor and corresponding degeneration resistor can be achieved. For example, with respect to the first bias current used for biasing the pair of input transistors, correctly proportioning PTAT and ZTAT currents in the main transconductance branch provides an effective transconductance ($g_m$) that remains substantially constant across different temperatures for IMD3 cancellation. Likewise, with respect to the second bias current used for biasing the pair of distortion cancellation transistors, correctly proportioning CTAT and ZTAT currents can achieve reliable temperature invariant IMD3 cancellation.

The distributed amplifiers herein can be used in a wide variety of applications, including, but not limited, to cellular infrastructure, aerospace, and/or instrumentation.

FIG. 1 is a schematic diagram of a distributed amplifier 10 according to one embodiment. The distributed amplifier 10 includes a differential input transmission line 1 that receives an RF input signal $RF_{IN}$, a differential output transmission line 2 that provides an amplified RF output signal $RF_{OUT}$, a plurality of differential distributed amplifier stages 3, a differential non-linearity cancellation stage 4, and a bias control circuit 5.

As shown in FIG. 1, the differential distributed amplifier stages 3 are connected between the differential input transmission line 1 and the differential output transmission line 2 at different points. Any number of differential distributed amplifier stages 3 (for instance, two, three, four, or five or more) can be included. The differential distributed amplifier stages 3 are distributed along the transmission lines, and serve to amplify the RF input signal $RF_{IN}$ to generate the amplified RF output signal $RF_{OUT}$.

In the illustrated embodiment, the distributed amplifier 10 includes the non-linearity cancellation stage 4, which provides signal inversion relative to the differential distributed amplifier stages 3. For example, the non-linearity cancellation stage 4 can provide inverting amplification to the RF input signal $RF_{IN}$ while the differential distributed amplifier stages 3 can providing non-inverting amplification, or vice versa.

As shown in FIG. 1, the bias control circuit 5 separately controls the bias of the differential non-linearity cancellation stage 4 relative to the bias of the differential distributed amplifier stages 3. Thus, the relative biasing of the differential non-linearity cancellation stage 4 as compared to the differential distributed amplifier stages 3 can be controlled to provide a mechanism to tune the linearity of the distributed amplifier 10. For example, such tuning can mitigate third-order intermodulation distortion (IMD3) of the distributed amplifier 10.

In certain implementations, the differential distributed amplifier stages 3 are each implemented as a cascode stage, and the differential non-linearity cancellation stage 3 serves to reduce or eliminate IMD3 arising from non-linear capacitance of the cascode transistors of the differential distributed amplifier stages 3. Such non-linearity can arise from changes in cascode transistor biasing as the RF signal level of the RF output signal $RF_{OUT}$ varies across an RF signal cycle.

Figure 2A:
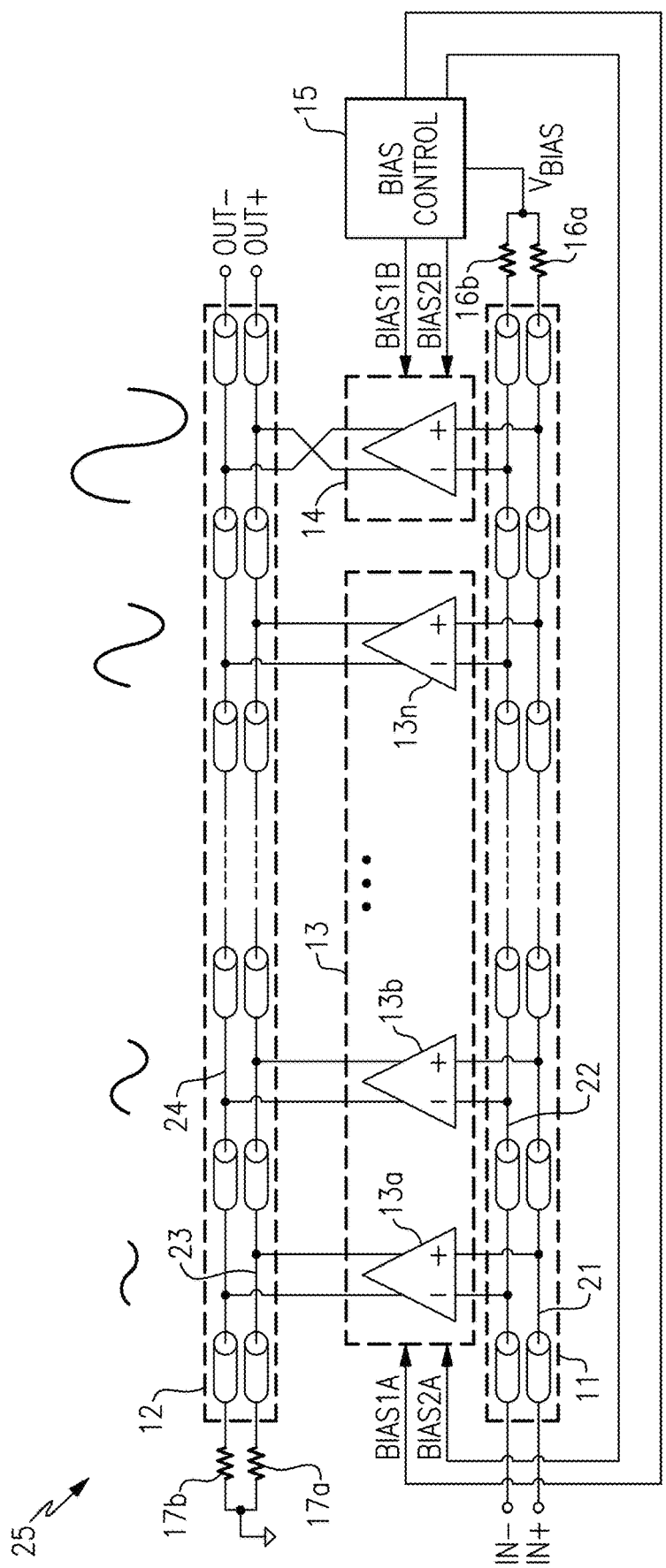
FIG. 2A is a schematic diagram of a distributed amplifier according to another embodiment.

FIG. 2A is a schematic diagram of a distributed amplifier 25 according to another embodiment. The distributed amplifier 25 includes a differential input transmission line 11, a differential output transmission line 12, a plurality of differential distributed amplifier stages 13, a differential non-linearity cancellation stage 14, a bias control circuit 15, a first input transmission line biasing resistor 16a, a second input transmission line biasing resistor 16b, a first output transmission line biasing resistor 17a, and a second output transmission line biasing resistor 17b.

As shown in FIG. 2A, the differential input transmission line 11 includes a first transmission line conductor 21 having a first end connected to a non-inverting input terminal IN+ and a second end that receives a bias voltage $V_{bias}$ by way of the first input transmission line biasing resistor 16a. The differential input transmission line 11 further includes a second transmission line conductor 22 having a first end connected to an inverting input terminal IN− and a second end that receives the bias voltage $V_{bias}$ by way of the second input transmission line biasing resistor 16b. The non-inverting input terminal IN+ and the inverting input terminal IN− collectively operate as a differential input terminal for receiving a differential RF input signal.

With continuing reference to FIG. 2A, the differential output transmission line 12 includes a first transmission line conductor 23 having a first end that receives a DC voltage (for instance, ground) by way of the first output transmission line biasing resistor 17a and a second end connected to a non-inverting output terminal OUT+. The differential output transmission line 12 further includes a second transmission line conductor 24 having a first end that receives the DC voltage by way of the second output transmission line biasing resistor 17b and a second end connected to an inverting output terminal OUT−. Although an example in which ground is used to bias the differential output transmission line 12 is depicted, the differential output transmission line 12 can be biased in other ways. The non-inverting output terminal OUT+ and the inverting output terminal OUT− collectively operate as a differential output terminal for providing an amplified differential RF output signal.

The differential distributed amplifier stages 13 include stages 13a, 13b, 13n distributed along the differential input transmission line 11 and the differential output transmission line 12. The total number of differential distributed amplifier stages 13 can be any desired integer n stages. For example, n can be 3, 4, 5, or 6 or more stages.

In the illustrated embodiment, the differential non-linearity cancellation stage 14 is also connected between the differential input transmission line 11 and the differential output transmission line 12, but provides signal inversion relative to each of the differential distributed amplifier stages 13. For example, the differential output of the differential non-linearity cancellation stage 14 is cross-coupled relative to the differential outputs of each of the differential distributed amplifier stages 13, in this embodiment.

The differential non-linearity cancellation stage 14 can be connected between the differential input transmission line 11 and the differential output transmission line 12 at a wide variety of points. In the illustrated embodiment, the differential non-linearity cancellation stage 14 is located after the differential distributed amplifier stages 13 with respect to RF signal flow along the input and output transmission lines. Implementing the differential non-linearity cancellation stage 14 in this manner provides efficient non-linearity cancellation since the RF signal waveform is typically larger at the end of the differential output transmission line 12 than at the start of the differential output transmission line 12, as graphically depicted in FIG. 2A.

As shown in FIG. 2A, the bias control circuit 15 separately controls the bias of the differential non-linearity cancellation stage 14 relative to the bias of the differential distributed amplifier stages 13. For example, the bias control circuit 15 generates a first pair of bias signals (BIAS1A and BIAS2A) for commonly controlling the differential distributed amplifier stages 13, and generates a second pair of bias signals (BIAS2A and BIAS2B) for controlling the differential non-linearity cancellation stage 14. Although FIG. 2A depicts an example distributed amplifier in which each of the differential distributed amplifier stages 13 is commonly biased, the teachings are also applicable to distributed amplifiers in which all or a portion of the differential distributed amplifier stages 13 are separately biased.

In the illustrated embodiment, the bias control circuit 15 uses the first pair of bias signals (BIAS1A and BIAS2A) and the second pair of bias signals (BIAS1B and BIAS2B) to control the relative biasing between the differential non-linearity cancellation stage 14 as compared to the differential distributed amplifier stages 13. By implementing the distributed amplifier 25 in this manner, a mechanism is provided for tuning linearity and mitigating IMD3.

In certain implementations, the differential non-linearity cancellation stage 14 and each of the differential distributed amplifier stages 13 are implemented as a cascode stage including a pair of input transistors (for instance, a pair of common source transistors or a pair of common emitter transistors) in series with at least one pair of cascode transistors, and a pair of distortion cancellation transistors that are cross-coupled with the input transistors. Additionally one of the bias signals (for instance, BIAS1A for the stages 13 or BIAS1B for stage 14) controls the bias current of the input transistors, while the other of the bias signals (for instance, BIAS2A for the stages 13 or BIAS2B for stage 14) controls the bias current of the distortion cancellation transistors.

In such implementations, the distributed amplifier 25 includes two structures for non-linearity cancellation: (i) the pair of distortion cancellation transistors for cancelling non-linearity of the pair of input transistors; and (ii) the differential non-linearity cancellation stage 14 to provide further non-linearity cancellation (for instance, any residual non-linearity after the initial distortion cancellation) associated with the cascode transistors.

In the illustrated embodiment, the bias control circuit 15 also controls the bias voltage $V_{BIAS}$ provided to the differential input transmission line 11. In certain implementations, the bias voltage $V_{BIAS}$ serves to bias the input gate voltages or input base voltages of a pair of input transistors of each amplifier stage, thereby providing a further mechanism or knob for controlling amplifier biasing.

The settings of the first pair of bias signals (BIAS1A and BIAS2A) and settings of the second pair of bias signals (BIAS1B and BIAS2B) can be controlled in a wide variety of ways, including, but not limited to, using data received over a serial interface or bus.

In certain implementations, settings of the first pair of bias signals (BIAS1A and BIAS2A) and settings of the second pair of bias signals (BIAS1B and BIAS2B) are stored in a memory of the bias control circuit 15, for instance, a non-volatile memory such as a flash memory, a read-only memory (ROM), fuses, anti-fuses, and/or a magnetic storage device.

Figure 2B:
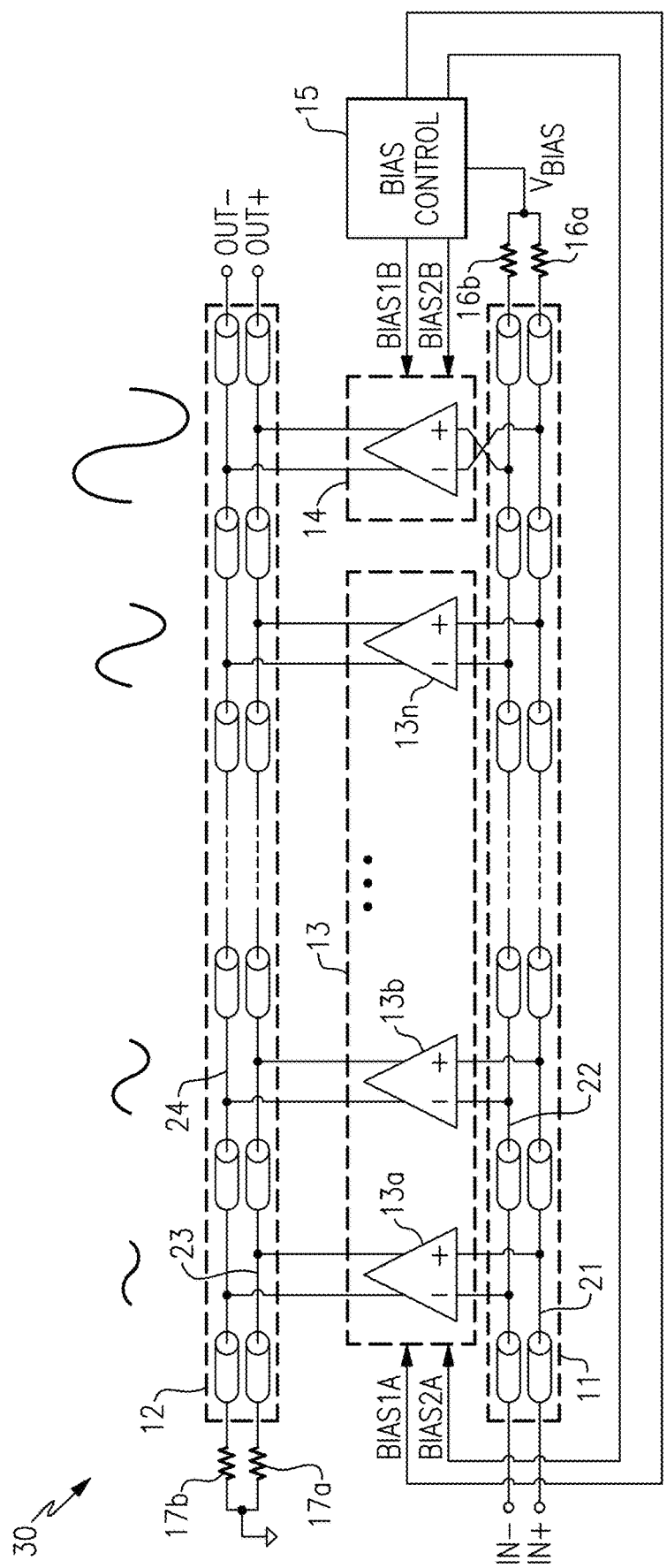
FIG. 2B is a schematic diagram of a distributed amplifier according to another embodiment.

FIG. 2B is a schematic diagram of a distributed amplifier 30 according to another embodiment. The distributed amplifier 30 includes a differential input transmission line 11, a differential output transmission line 12, a plurality of differential distributed amplifier stages 13, a differential non-linearity cancellation stage 14, a bias control circuit 15, a first input transmission line biasing resistor 16a, a second input transmission line biasing resistor 16b, a first output transmission line biasing resistor 17a, and a second output transmission line biasing resistor 17b.

The distributed amplifier 30 of FIG. 2B is similar to the distributed amplifier 25 of FIG. 2A, except that the distributed amplifier 30 illustrates a different implementation for achieving the signal inversion of the differential non-linearity cancellation stage 14 relative to the differential distributed amplifier stages 13. In particular, rather than cross-coupling the differential output of the differential non-linearity cancellation stage 14 relative to the differential outputs of the differential distributed amplifier stages 13 as shown in the embodiment of FIG. 2A, the embodiment of FIG. 2B cross-couples the differential input of the differential non-linearity cancellation stage 14 relative to the differential inputs of the differential distributed amplifier stages 13.

Figure 3B:
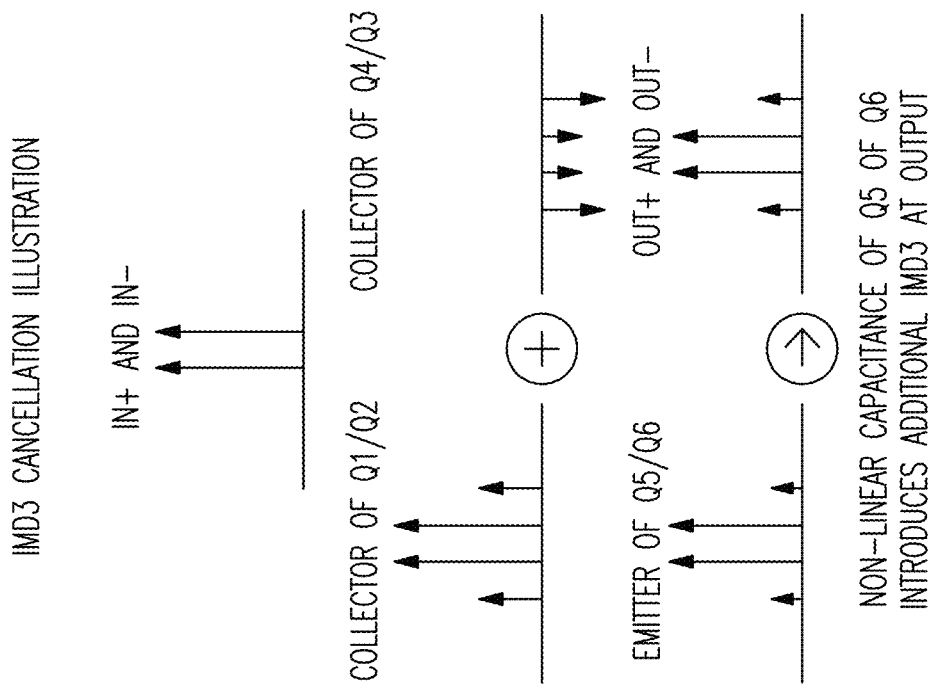
FIG. 3B is a plot of one example of third-order intermodulation distortion (IMD3) cancellation for the differential amplifier circuit of FIG. 3A.
Figure 3A:
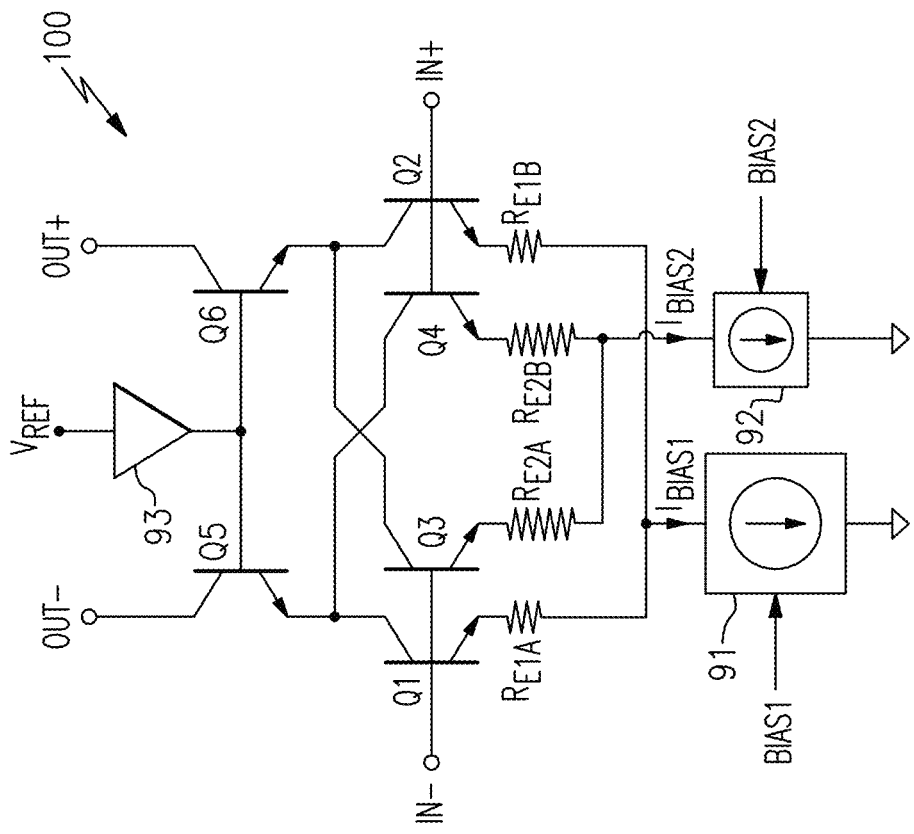
FIG. 3A is a schematic diagram of one embodiment of a differential amplifier circuit for serving as either a differential distributed amplifier stage or a differential non-linearity cancellation stage.

FIG. 3A is a schematic diagram of one embodiment of a differential amplifier circuit 100 for serving as either a differential distributed amplifier stage or a differential non-linearity cancellation stage. For example, multiple instantiations of the differential amplifier circuit 100 can be used to implement the differential non-linearity cancellation stage 14 and each of the differential distributed amplifier stages 13 of the distributed amplifiers depicted in FIGS. 2A and 2B.

Although one embodiment of a differential amplifier circuit is depicted, the teachings herein are applicable to amplifier stages implemented in a wide variety of ways. Furthermore, although the differential non-linearity cancellation stage 14 can have the same implementation (for instance, an identical amplifier topology) as the differential distributed amplifier stages 13, the teachings herein are also applicable to distributed amplifiers in which the differential non-linearity cancellation stage 14 has a different implementation relative to the differential distributed amplifier stages 13.

In the illustrated embodiment, the differential amplifier circuit 100 includes a pair of input transistors (Q1 and Q2), a pair of distortion cancellation transistors (Q3 and Q4), a pair of cascode transistors (Q5 and Q6), a first pair of degeneration resistors ($R_{E1A}$ and $R_{E1B}$), a second pair of degeneration resistors ($R_{E2A}$ and $R_{E2B}$), a first controllable current source 91, a second controllable current source 92, and a cascode biasing circuit 93. The differential amplifier circuit further includes a pair of input terminals (IN+ and IN−) for connecting to a differential input transmission line and a pair of output terminals (OUT+ and OUT−) for connecting to a differential output transmission line.

Although an example with bipolar transistors is shown, the teachings herein are also applicable to implementations using field-effect transistors (FETs) or a combination of FETs and bipolar transistors. Examples of FETs including not only metal-oxide-semiconductor FETs (MOSFETs), such as silicon on insulator (SOI) MOSFETS, but also metal-semiconductor FETs, such as high electron mobility transistors (HEMTs).

As shown in FIG. 3A, the pair of input transistors (Q1 and Q2) are connected as a pair of common emitter transistors biased by a first bias current $I_{BIAS1}$ provided by the first controllable current source 91. Additionally, the pair of distortion cancellation transistors (Q3 and Q4) are cross-coupled with the input transistors (Q1 and Q2), and biased by a second bias current $I_{BIAS2}$ provided by the second controllable current source 92. As depicted in FIG. 3A, the bases of the Q1 and Q3 are both connected to IN− and the bases of Q2 and Q4 are both connected to IN+, and the collector of Q4 connects to the collector of Q1 and the collector of Q3 connects to the collector of Q2 to provide cross-coupling.

In the illustrated embodiment, the first pair of degeneration resistors ($R_{E1A}$ and $R_{E1B}$) serve to provide resistive degeneration to the pair of input transistors (Q1 and Q2) for linearizing the differential amplifier circuit 100. Additionally, the second pair of degeneration resistors ($R_{E2A}$ and $R_{E2B}$) serve to provide resistive degeneration to the pair of distortion cancellation transistors (Q3 and Q4). In certain implementations, the resistance of the second pair of degeneration resistors ($R_{E2A}$ and $R_{E2B}$) is at least a factor of 10 larger than the resistance of the first pair of degeneration resistors ($R_{E1A}$ and $R_{E1B}$).

As shown in FIG. 3A, the cascode transistor Q5 is connected in series between the collector of Q1 and OUT−, while the cascode transistor Q6 is connected in series between the collector of Q2 and OUT+. Additionally, the cascode biasing circuit 93 receives a reference voltage $V_{REF}$, and generates a bias voltage for the bases of Q5 and Q6. In certain implementations, the cascode biasing circuit 93 is implemented as an emitter follower biasing circuit, which can aid in providing robust stability (for instance, suppression of unintended oscillation) to the differential amplifier circuit 100.

In the illustrated embodiment, the first bias signal BIAS1 is provided to the first controllable current source 91 to control an amount of the first bias current $I_{BIAS1}$ for biasing the pair of input transistors (Q1 and Q2). Additionally, the second bias signal BIAS2 is provided to the second controllable current source 92 to control an amount of the second bias current $I_{BIAS2}$.

FIG. 3B is a plot of one example of IMD3 cancellation for the differential amplifier circuit 100 of FIG. 3A. As shown in FIG. 3B, relative control between the first bias current $I_{BIAS1}$ and the second bias current $I_{BIAS2}$ allows for cancellation of IMD3 components at the collectors of the pair of input transistors (Q1 and Q2).

For example, tuning of either $I_{BIAS1}$ or $I_{BIAS2}$ can be performed such that IMD3 at the collectors of the pair of input transistors (Q1 and Q2) is of about equal magnitude but of opposite phase relative to the IMD3 at the collectors of the pair of distortion cancellation transistors (Q3 and Q4). Additionally, magnitude of the fundamental at the collectors of the pair of distortion cancellation transistors (Q3 and Q4) is relatively small due to heavy degeneration provided by the second pair of degeneration resistors ($R_{E2A}$ and $R_{E2B}$).

Thus, such tuning can be used to cancel IMD3 arising from non-linearity of pair of input transistors (Q1 and Q2). However, non-linear capacitance of the pair of cascode transistors (Q5 and Q6) introduces additional IMD3 at OUT+ and OUT−.

Such residual IMD3 is reduced or eliminated by including a differential non-linearity cancellation stage (for example, the differential non-linearity cancellation stage 4 of FIG. 1 or stage 14 of FIGS. 2A and 2B) implemented in accordance with the teachings herein.

In one embodiment, the distributed amplifier 25 of FIG. 2A or the distributed amplifier 30 of FIG. 2B is implemented with stages implemented in accordance with the differential amplification circuit 100 of FIG. 3A. In such an embodiment, the values of first pair of bias signals (BIAS1A and BIAS2A) and the second pair of bias signals (BIAS1B and BIAS2B) can be selected to achieve cancellation of IMD3, including both a component arising from non-linearity of the input transistors as well as a component arising from non-linearity of the cascode transistors.

In one example, the second pair of bias signals (BIAS1B and BIAS2B) are initially set to disable the differential non-linearity cancellation stage 14, and the bias signal BIAS2A is changed relative to the bias signal BIAS1A (or vice versa) to achieve a bias setting of the differential distributed amplifier stages 13 associated with low IMD3. For example, IMD3 of an amplified RF output signal provided by the differential output transmission line 12 can be observed across different bias settings until a setting of the first pair of bias signals (BIAS1A and BIAS2A) with about the lowest IMD3 is identified. Thereafter, IMD3 of the amplified RF output signal can be observed for different settings of the second pair of bias signals (BIAS1B and BIAS2B) while using the previously selected setting of the first pair of bias settings (BIAS1A and BIAS2A). Bias settings determined by such a process can be stored in a memory of the bias control circuit 15.

Moreover, the stored bias settings can serve to track and cancel varying IMD3 arising from cascode transistors across a wide range of frequency, including at high frequencies. For example, IMD3 generated by the non-linear capacitance of the cascode devices is exacerbated at higher frequencies relative to lower frequencies. By including a non-linearity cancellation stage such IMD3 is tracked and canceled across frequency, thereby helping the distributed amplifier in achieving a high gain-bandwidth product and extending operating frequency range.

Figure 4A:
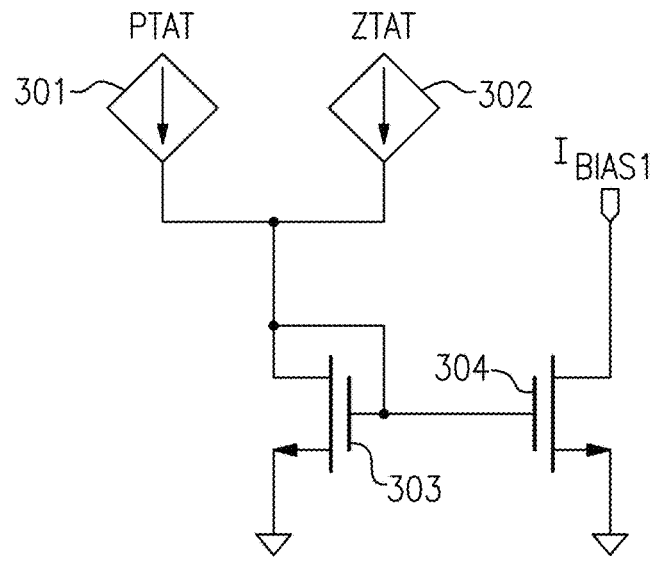
FIG. 4A is a schematic diagram of a current source for a distributed amplifier stage according to one embodiment.

FIG. 4A is a schematic diagram of a current source 310 for a distributed amplifier stage according to one embodiment. The current source 310 includes a controllable PTAT current source 301, a controllable ZTAT current source 302, a first current mirror FET 303, and a second current mirror FET 304.

The current source 310 of FIG. 4A illustrates one embodiment of the first controllable current source 91 of the FIG. 3A. For example, the bias signal BIAS1 of FIG. 3A can be used to scale both the magnitude of current from the controllable PTAT current source 301 and the magnitude of current from the controllable ZTAT current source 302. In one implementation, a ratio of current from the controllable PTAT current source 301 to the controllable ZTAT current source 302 is selected by design based on input transistor size relative to the resistance of degeneration resistors associated with the input transistors. In another implementation, the ratio of PTAT and ZTAT current is set by an additional control signal (not shown in FIG. 3A).

The current source 310 of FIG. 4A provides temperature tracking to enhance the performance of a differential amplification circuit biased by the current source 310. For example, a predominantly PTAT bias current can be desirable to achieve relatively constant $g_m$ of a pair of input transistors biased by the first bias current $I_{BIAS1}$, with a component of ZTAT current included due to presence of degeneration resistors, which have relatively low temperature correlation.

Figure 4B:
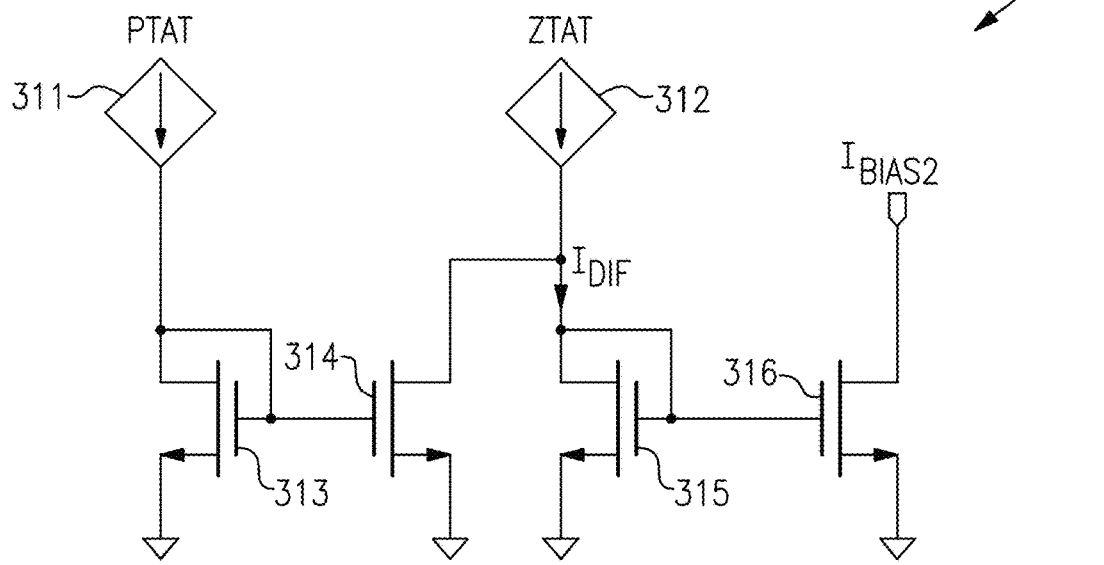
FIG. 4B is a schematic diagram of a current source for a distributed amplifier stage according to another embodiment.
Figure 6A:
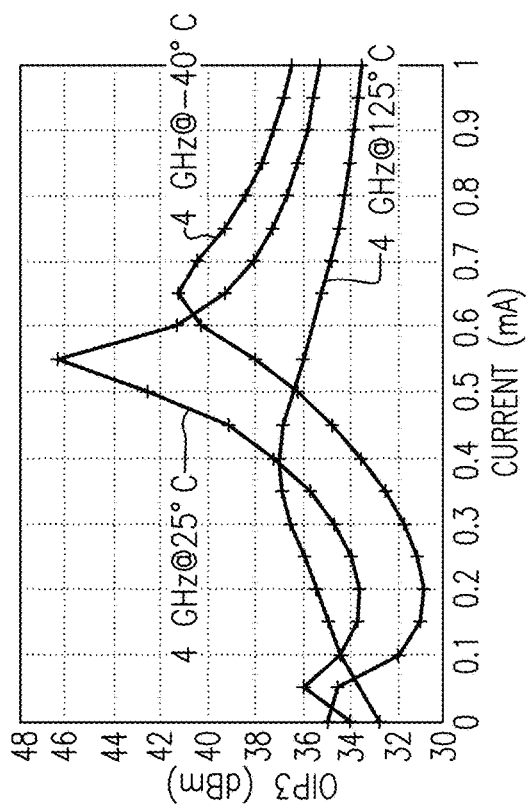
FIG. 6A depicts one example of plots of OIP3 versus non-linearity cancellation bias current without temperature compensation at 1 gigahertz (GHz) for different temperatures.
Figure 6B:
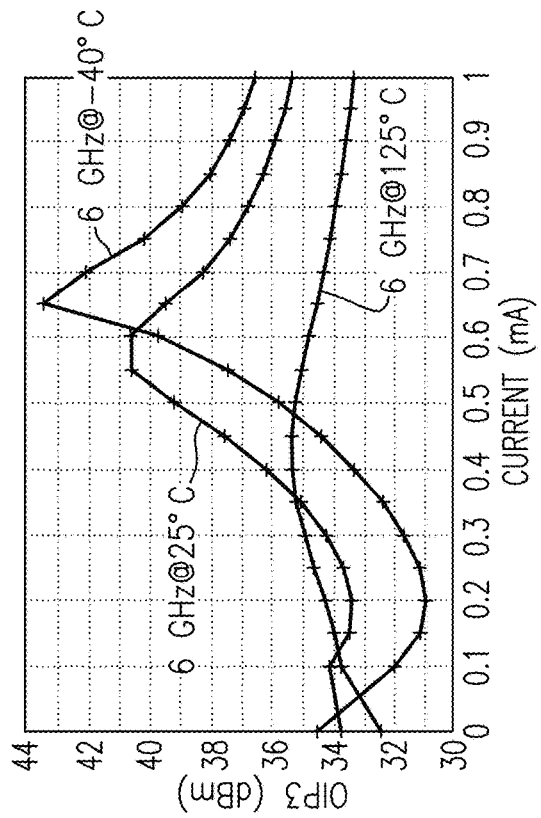
FIG. 6B depicts one example of plots of OIP3 versus non-linearity cancellation bias current without temperature compensation at 2 GHz for different temperatures.
Figure 6C:
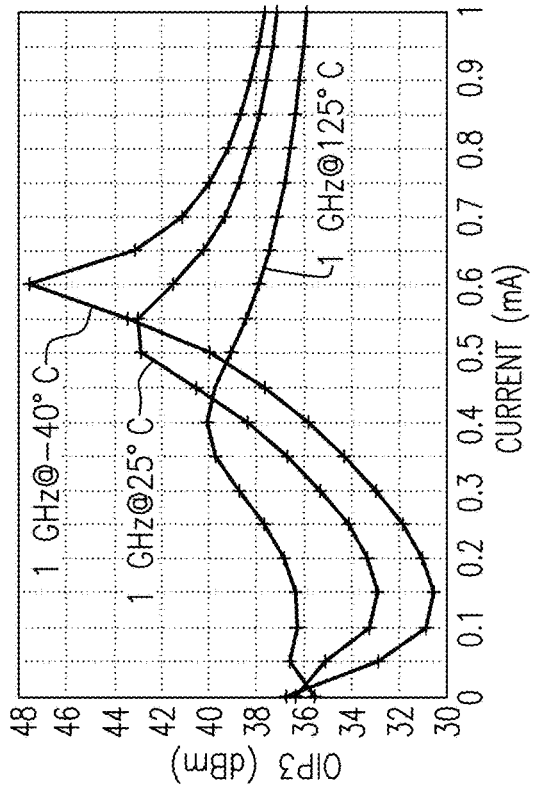
FIG. 6C depicts one example of plots of OIP3 versus non-linearity cancellation bias current without temperature compensation at 4 GHz for different temperatures.
Figure 6D:
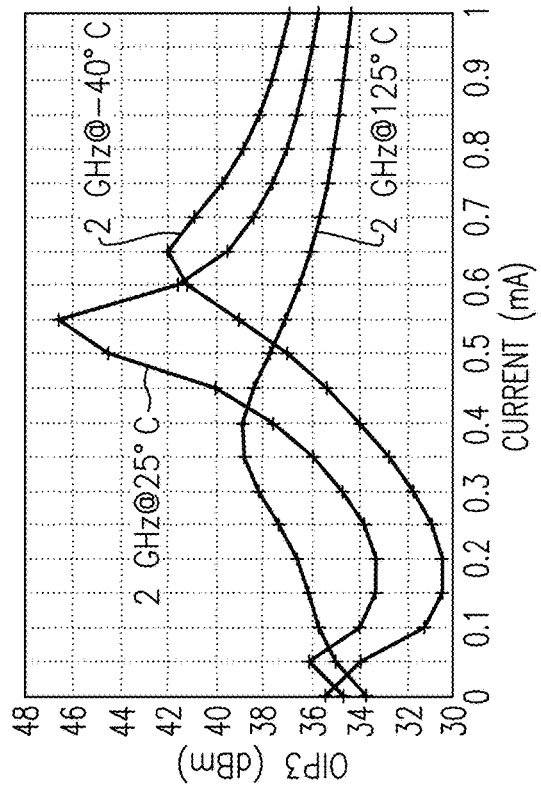
FIG. 6D depicts one example of plots of OIP3 versus non-linearity cancellation bias current without temperature compensation at 6 GHz for different temperatures.
Figure 7A:
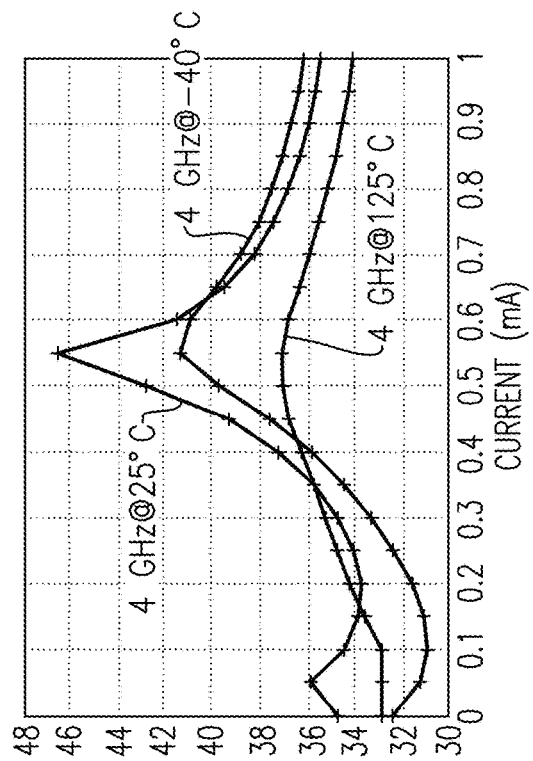
FIG. 7A depicts another example of plots of OIP3 versus non-linearity cancellation bias current with temperature compensation at 1 GHz for different temperatures.
Figure 7C:
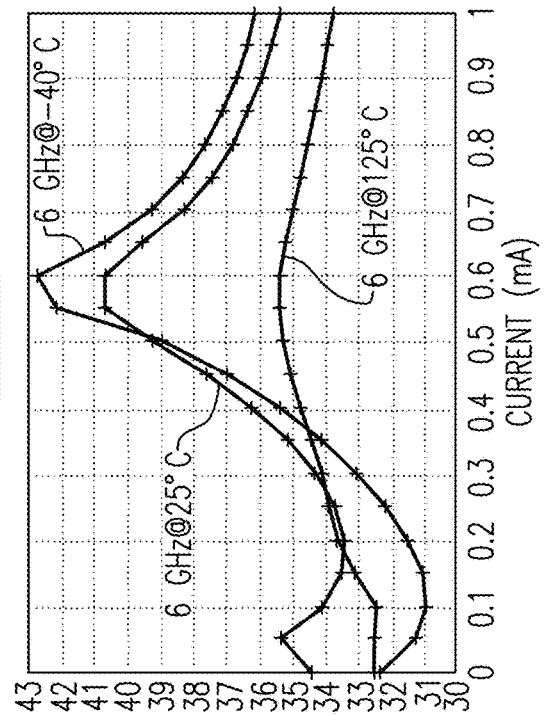
FIG. 7C depicts another example of plots of OIP3 versus non-linearity cancellation bias current with temperature compensation at 4 GHz for different temperatures.
Figure 7B:
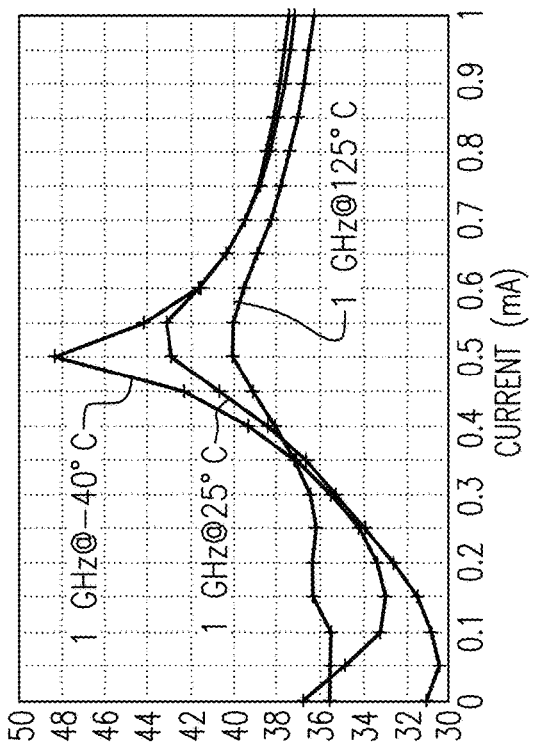
FIG. 7B depicts another example of plots of OIP3 versus non-linearity cancellation bias current with temperature compensation at 2 GHz for different temperatures.
Figure 7D:
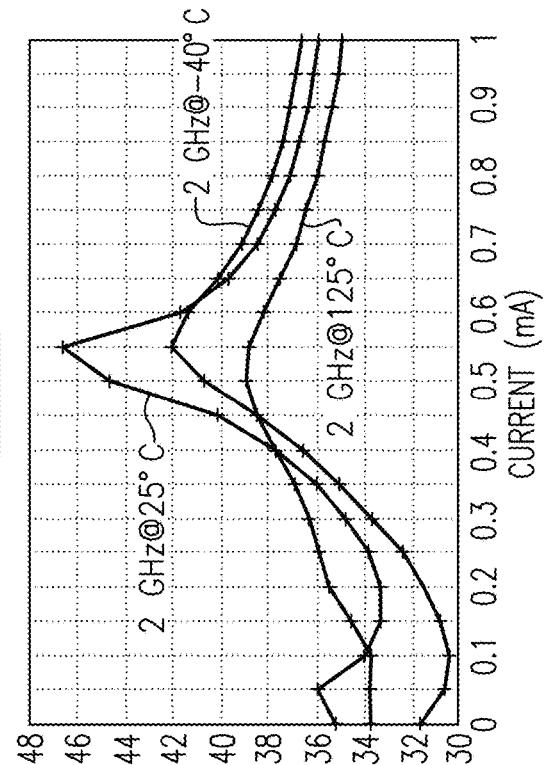
FIG. 7D depicts another example of plots of OIP3 versus non-linearity cancellation bias current with temperature compensation at 6 GHz for different temperatures.

FIG. 4B is a schematic diagram of a current source 320 for a distributed amplifier stage according to another embodiment. The current source 320 includes a controllable PTAT current source 311, a controllable ZTAT current source 312, a first current mirror FET 313, a second current mirror FET 314, a third current mirror FET 315, and a fourth current mirror FET 316.

The current source 320 of FIG. 4B illustrates one embodiment of the second controllable current source 92 of the FIG. 3A. For example, the bias signal BIAS2 of FIG. 3A can be used to scale the magnitude of current from the controllable PTAT current source 311 and the magnitude of current from the controllable ZTAT current source 312. In one implementation, a ratio of current from the controllable PTAT current source 311 to the controllable ZTAT current source 312 is selected by design based on the size of distortion cancellation transistors relative to the resistance of degeneration resistors associated with the transistors. In another implementation, the ratio of PTAT and ZTAT current is set by an additional control signal (not shown in FIG. 3B).

In the illustrated embodiment, a difference between a ZTAT current and a mirrored PTAT current is used to generate a difference current $I_{DIF}$ that is partially CTAT. The difference current $I_{DIF}$ is mirrored to generate the second bias current $I_{BIAS2}$, which is also partially CTAT.

CTAT behavior of the second bias current IBIAS2 is another mechanism that can be used to achieve temperature insensitivity of a differential amplification circuit (for instance, the differential amplification circuit 100 of FIG. 3A).

FIG. 5 depicts one example of plots of OIP3 versus non-linearity cancellation bias current for different frequencies. The plots depict one example of simulation results of the distributed amplifier 10 of FIG. 1, with the current axis representing a bias current of the differential non-linearity cancellation stage 4 with the bias current of the differential distributed amplifier stages 3 fixed. Plots are included for RF input signal frequencies of 1 GHz, 2 GHz, 4 GHz, and 6 GHz.

FIGS. 6A-6D depict examples of plots of OIP3 versus non-linearity cancellation bias current at different frequencies and temperatures for one implementation of the distributed amplifier 25 of FIG. 2A with stages implemented using the differential amplification circuit 100 of FIG. 3A. The simulations are taken with a ratio of BIAS1A to BIAS2A and a ratio of BIAS1B to BIAS2B fixed to provide IMD3 trimming of input transistors, and thereafter using BIAS1B to vary a bias current of the differential non-linearity cancellation stage 14 in accordance with the graphs. The ratios are maintained constant by varying the magnitudes of the bias signals together.

The simulations of FIGS. 6A-6D correspond to a simulation in which the first controllable current source 91 and the second controllable current source 92 are implemented without temperature compensation.

FIGS. 7A-7D depict examples of plots of OIP3 versus non-linearity cancellation bias current at different frequencies and temperatures for one implementation of the distributed amplifier 25 of FIG. 2A with stages implemented using the differential amplification circuit 100 of FIG. 3A and further with the first controllable current source 91 implemented using the controllable current source 310 of FIG. 4A. The simulations are taken with a ratio of BIAS1A to BIAS2A and a ratio of BIAS1B to BIAS2B fixed. The ratios are maintained constant by varying the magnitudes of the bias signals together. Although OIP3 performance plots are depicted for a differential amplification circuit using the controllable current source 310 of FIG. 4A, similar benefits can be achieved for a differential amplification circuit using the controllable current source 320 FIG. 4B.

As shown by a comparison of FIGS. 7A-7D to FIGS. 6A-6D, implementing a controllable current source with temperature compensation provides a further improvement in OIP3 across temperature. Moreover, using a controllable current source with temperature compensation enhances robustness of linearization by preserving about optimal trim current across temperature without needing to constantly re-trim.

Although various examples of simulation results have been shown, simulation or measurement results can vary based on a wide variety of factors, such as simulation models, simulation tools, simulation parameters, measurement conditions, fabrication technology, and/or implementation details. Accordingly, other results are possible.

Figure 8:
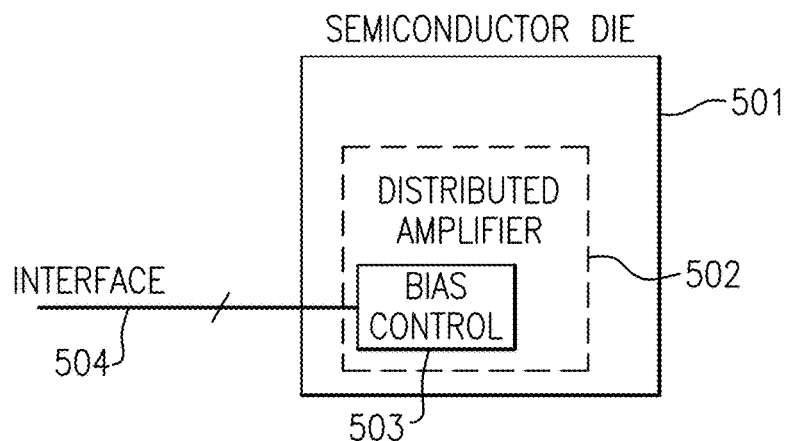
FIG. 8 is a schematic diagram of one embodiment of a semiconductor die including a distributed amplifier.

FIG. 8 is a schematic diagram of one embodiment of a semiconductor die 501 including a distributed amplifier 502. The distributed amplifier 502 can be implemented in accordance with any of the embodiments herein. As shown in FIG. 8, the distributed amplifier 502 includes a bias control circuit 503 that receives data over a serial interface 504. Thus, data for controlling biasing settings of the distributed amplifier 502 is provided by the serial interface 504, in this example. Additionally or alternatively, memory of the bias control circuit 503 can store such settings. For example, the bias control circuit 503 can store such settings in a non-volatile memory such as a flash memory, a ROM, fuses, anti-fuses, and/or a magnetic storage device.

Figure 9:
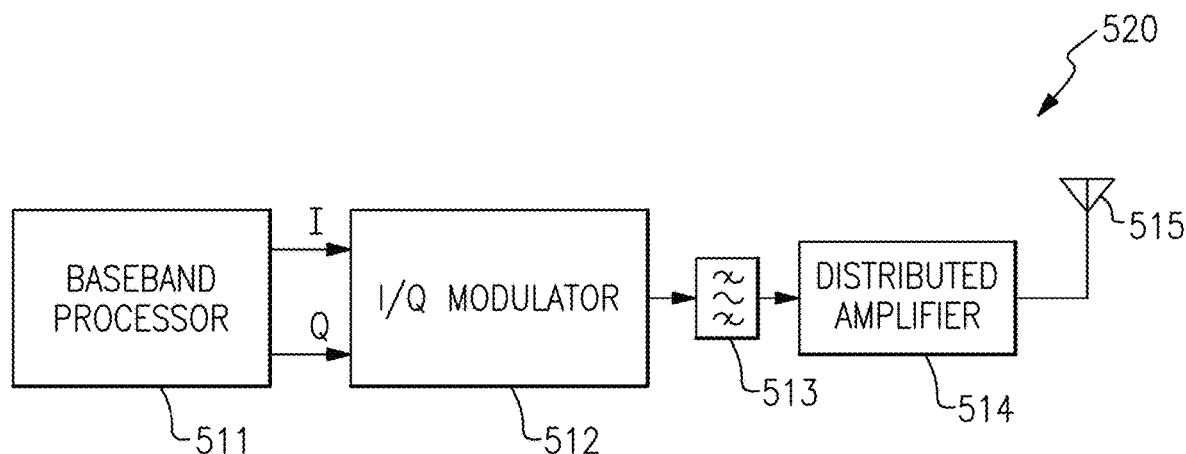
FIG. 9 is a schematic diagram of one embodiment of an RF communication system including a distributed amplifier according to one embodiment.

FIG. 9 is a schematic diagram of one embodiment of an RF communication system 520 according to one embodiment. The RF communication system 520 includes a baseband processor 511, an I/Q modulator 512, a bandpass filter 513, a distributed amplifier 514, and an antenna 515. The distributed amplifier 514 can be implemented in accordance with any of the embodiments herein.

The RF communication system 520 of FIG. 9 illustrates one application of a distributed amplifier implemented in accordance with the teachings herein. For example, a distributed amplifier can be used to amplify RF signals in a transmit path and/or a receive path of an RF communication system.

Although one example application of a distributed amplifier is shown, the distributed amplifiers herein can be used in a wide variety of applications and usage scenarios.

Applications

Devices employing the above described schemes can be implemented into various electronic devices. Examples of electronic devices include, but are not limited to, RF communication systems, consumer electronic products, electronic test equipment, communication infrastructure, etc. For instance, one or more distributed amplifiers can be included in a wide range of RF communication systems, including, but not limited to, radar systems, base stations, mobile devices (for instance, smartphones or handsets), phased array antenna systems, laptop computers, tablets, and/or wearable electronics.

The teachings herein are applicable to RF communication systems operating over a wide range of frequencies, including not only RF signals between 100 MHz and 7 GHz, but also to higher frequencies, such as those in the X band (about 7 GHz to 12 GHz), the $K_u$ band (about 12 GHz to 18 GHz), the K band (about 18 GHz to 27 GHz), the $K_a$ band (about 27 GHz to 40 GHz), the V band (about 40 GHz to 75 GHz), and/or the W band (about 75 GHz to 110 GHz). Accordingly, the teachings herein are applicable to a wide variety of RF communication systems, including microwave communication systems.

The signals amplified by the distributed amplifiers herein can be associated with a variety of communication standards, including, but not limited to, Global System for Mobile Communications (GSM), Enhanced Data Rates for GSM Evolution (EDGE), Code Division Multiple Access (CDMA), wideband CDMA (W-CDMA), 3G, Long Term Evolution (LTE), 4G, and/or 5G, as well as other proprietary and non-proprietary communications standards.

Conclusion

The foregoing description may refer to elements or features as being "connected" or "coupled" together. As used herein, unless expressly stated otherwise, "connected" means that one element/feature is directly or indirectly connected to another element/feature, and not necessarily mechanically. Likewise, unless expressly stated otherwise, "coupled" means that one element/feature is directly or indirectly coupled to another element/feature, and not necessarily mechanically. Thus, although the various schematics shown in the figures depict example arrangements of elements and components, additional intervening elements, devices, features, or components may be present in an actual embodiment (assuming that the functionality of the depicted circuits is not adversely affected).

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while the disclosed embodiments are presented in a given arrangement, alternative embodiments may perform similar functionalities with different components and/or circuit topologies, and some elements may be deleted, moved, added, subdivided, combined, and/or modified. Each of these elements may be implemented in a variety of different ways. Any suitable combination of the elements and acts of the various embodiments described above can be combined to provide further embodiments. Accordingly, the scope of the present invention is defined only by reference to the appended claims.

Although the claims presented here are in single dependency format for filing at the USPTO, it is to be understood that any claim may depend on any preceding claim of the same type except when that is clearly not technically feasible.

What is claimed is:

1. A distributed amplifier with controllable linearization, the distributed amplifier comprising:
   a differential input transmission line configured to receive a radio frequency (RF) input signal;
   a differential output transmission line;
   a plurality of differential distributed amplifier stages each connected between the differential input transmission line and the differential output transmission line, wherein the plurality of differential distributed amplifier stages are configured to amplify the RF input signal to generate an amplified RF output signal on the differential output transmission line; and
   a differential non-linearity cancellation stage connected between the differential input transmission line and the differential output transmission line and providing an inversion to the RF input signal relative to the plurality of differential distributed amplifier stages, wherein a bias of the differential non-linearity cancellation stage is separately controllable from a bias of the plurality of differential distributed amplifier stages.

2. The distributed amplifier of claim 1, wherein the plurality of differential distributed amplifier stages are each implemented as a differential cascode stage including at least one pair of cascode transistors, the differential non-linearity cancellation stage operable to cancel non-linearity arising from a capacitance of the at least one pair of cascode transistors.

3. The distributed amplifier of claim 1, wherein the differential non-linearity cancellation stage is connected to the differential output transmission line after each of the plurality of differential distributed amplifier stages with respect to a direction of propagation of the amplified RF output signal along the differential output transmission line.

4. The distributed amplifier of claim 1, wherein each of the differential distributed amplifier stages includes a differential output connected to the differential output transmission line, wherein the differential non-linearity cancellation stage includes a differential output that is cross-coupled to the differential output transmission line relative to the differential outputs of the plurality of differential distributed amplifier stages.

5. The distributed amplifier of claim 1, wherein each of the plurality of differential distributed amplifier stages includes a pair of input transistors biased by a first current, and a pair of distortion compensation transistors cross-coupled with the pair of input transistors and biased by a second current.

6. The distributed amplifier of claim 5, wherein at least one of the first current or the second current is controllable to compensate for non-linearity of the pair of input transistors.

7. The distributed amplifier of claim 6, wherein each of the plurality of differential distributed amplifier stages further includes a pair of cascode transistors, wherein the differential non-linearity cancellation stage is operable to compensate for non-linearity of the pair of cascode transistors.

8. The distributed amplifier of claim 5, further comprising a current source configured to generate the first current based on adding a proportional to absolute temperature (PTAT) current and a zero to absolute temperature (ZTAT) current such that the first current is PTAT in part.

9. The distributed amplifier of claim 5, further comprising a current source configured to generate the second current based on a difference of a PTAT current and a ZTAT current such that the second current is complementary to absolute temperature (CTAT) in part.

10. The distributed amplifier of claim 1, wherein each of the plurality of differential distributed amplifier stages includes a first pair of input transistors and a first pair of distortion compensation transistors cross-coupled with the first pair of input transistors, and wherein the differential non-linearity cancellation stage includes a second pair of input transistors and a second pair of distortion compensation transistors cross-coupled with the second pair of input transistors.

11. The distributed amplifier of claim 10, further comprising a bias control circuit configured to generate a first pair of bias signal for controlling biasing of the first pair of input transistors and the first pair of distortion compensation transistors, and a second pair of bias signals for controlling biasing of the second pair of input transistors and the second pair of distortion compensation transistors.

12. The distributed amplifier of claim 1, wherein the differential non-linearity cancellation stage and each of the plurality of differential distributed amplifier stages is implemented using bipolar transistors.

13. A method of linearizing a distributed amplifier, the method comprising:
    receiving a radio frequency (RF) input signal as an input to a differential input transmission line;
    amplifying the RF input signal to generate an amplified RF output signal using a plurality of differential distributed amplifier stages and a differential non-linearity cancellation stage each connected between the differential input transmission line and a differential output transmission line, the differential non-linearity cancellation stage providing an inversion to the RF input signal relative to the plurality of differential distributed amplifier stages; and
    separately controlling a bias of the differential non-linearity cancellation stage relative to a bias of the plurality of differential distributed amplifier stages to linearize the plurality of differential distributed amplifier stages.

14. The method of claim 13, wherein the plurality of differential distributed amplifier stages are each implemented as a differential cascode stage including at least one pair of cascode transistors, the method further comprising using the differential non-linearity cancellation stage to cancel non-linearity arising from a capacitance of the at least one pair of cascode transistors.

15. The method of claim 13, wherein each of the plurality of differential distributed amplifier stages includes a pair of input transistors and a pair of distortion compensation transistors cross-coupled with the pair of input transistors, the method further comprising controlling a difference in bias current between the pair of input transistors and the pair of distortion compensation transistors to compensate for non-linearity of the pair of input transistors.

16. The method of claim 15 further comprising generating a bias current of the pair of input transistors based on adding a proportional to absolute temperature (PTAT) current and a zero to absolute temperature (ZTAT) current such that the bias current is PTAT in part.

17. The method of claim 15 further comprising generating a bias current of the pair of distortion compensation transistors based on a difference of a PTAT current and a ZTAT current such that the bias current is complementary to absolute temperature (CTAT) in part.

18. A semiconductor die comprising:
a differential input transmission line;
a differential output transmission line;
a plurality of differential distributed amplifier stages each connected between the differential input transmission line and the differential output transmission line;
a differential non-linearity cancellation stage connected between the differential input transmission line and the differential output transmission line and providing a signal inversion relative to the plurality of differential distributed amplifier stages; and
a bias control circuit configured to separately control a bias of the differential non-linearity cancellation stage and a bias of the plurality of differential distributed amplifier stages.

19. The semiconductor die of claim 18, wherein each of the plurality of differential distributed amplifier stages includes a first pair of input transistors and a first pair of distortion compensation transistors cross-coupled with the first pair of input transistors, wherein the differential non-linearity cancellation stage includes a second pair of input transistors and a second pair of distortion compensation transistors cross-coupled with the second pair of input transistors, and wherein the bias control circuit generates a first bias signal configured to control a first bias current of the first pair of input transistors, a second bias signal configured to control a second bias current of the first pair of distortion compensation transistors, a third bias signal configured to control a third bias current of the second pair of input transistors, and a fourth bias signal configured to control a fourth bias current of the second pair of distortion compensation transistors.

20. The semiconductor die of claim 18, further comprising a serial interface configured to receive data for setting the bias of the differential non-linearity cancellation stage and for setting the bias of the plurality of differential distributed amplifier stages.

\* \* \* \* \*